United States Patent [19]
Alpaugh et al.

[11] Patent Number: 5,418,689
[45] Date of Patent: May 23, 1995

[54] PRINTED CIRCUIT BOARD OR CARD FOR DIRECT CHIP ATTACHMENT AND FABRICATION THEREOF

[75] Inventors: Warren A. Alpaugh, Chenango Forks; Voya R. Markovich, Endwell; Ajit K. Trivedi, Endicott; Richard S. Zarr, Apalachin, all of N.Y.

[73] Assignee: International Business Machines Corporation, Armonk, N.Y.

[21] Appl. No.: 12,111

[22] Filed: Feb. 1, 1993

[51] Int. Cl.⁶ ............................................. H05K 1/11
[52] U.S. Cl. ................................. 361/792; 361/794; 361/795; 174/250; 174/260; 174/262; 174/266
[58] Field of Search ............ 174/250, 260, 261, 262, 174/263, 266; 361/792, 793, 794, 795

[56] References Cited
U.S. PATENT DOCUMENTS

| | | |
|---|---|---|
| 3,436,819 | 4/1969 | Lunine . |
| 4,150,421 | 4/1979 | Nishihara et al. . |
| 4,572,764 | 2/1986 | Fan . |
| 4,642,160 | 2/1987 | Burgess . |
| 4,675,789 | 6/1987 | Kuwabara et al. ............... 361/794 |
| 4,854,038 | 8/1989 | Wiley ............................. 361/794 |
| 4,864,722 | 9/1989 | Lazzarini et al. ............... 361/794 |
| 4,935,584 | 6/1990 | Boggs . |
| 5,025,555 | 6/1991 | Mase . |

Primary Examiner—Leo P. Picard
Assistant Examiner—Bot Ledynh
Attorney, Agent, or Firm—Pollock, Vande Sande & Priddy

[57] ABSTRACT

A printed circuit board or card for direct chip attachment that includes at least one power core, at least one signal plane that is adjacent to the power core, and plated through holes for electrical connection is provided. In addition, a layer of dielectric material is adjacent the power core and a circuitized conductive layer is adjacent the dielectric material, followed by a layer of photosensitive dielectric material adjacent the conductive layer. Photodeveloped blind vias for subsequent connection to the power core and drilled blind vias for subsequent connection to the signal plane are provided. Also provided is process for fabricating the printed circuit board or card for direct chip attachment.

6 Claims, 3 Drawing Sheets

PRINTED CIRCUIT BOARD OR CARD FOR DIRECT CHIP ATTACHMENT AND FABRICATION THEREOF

TECHNICAL FIELD

The present invention is concerned with a printed circuit board or card that makes it possible to directly attach an integrated circuit chip or chips thereto. In addition, the present invention is concerned with a process for fabricating such a printed circuit board or card. The present invention is especially advantageous for applications that employ relatively high wiring densities. The objectives of the present invention are achieved by providing a redistribution structure of a signal plane and power plane onto a composite containing a plurality of alternating signal planes and power cores. Since the present invention provides for direct chip attachment, a level of packaging has been eliminated pursuant to the present invention.

BACKGROUND ART

With the advent of relatively large, high performance integrated circuit systems, continuing efforts are underway to optimize the packaging topology in order to reduce pack-age-caused delays and skews to a minimum. Moreover, the ever increasing desire and demands for speed and integration are significantly and dramatically increasing the amount of current that needs to be supplied to a module. Accordingly, the current topology employed is rapidly approaching a practical limit with respect to combining signal layers having fine lines and vias with relatively heavy power planes in order to distribute the current to the module.

SUMMARY OF INVENTION

The present invention makes it possible to provide relatively high density integrated circuit packaging. In addition, the present invention makes it possible to eliminate an entire level of packaging by making it possible to directly bond integrated circuit chips on the board or card itself.

In particular, the present invention is concerned with a printed circuit board or card that is suitable for direct chip attachment. The printed circuit board or card includes at least one power core, at least one signal plane that is adjacent to the power core, and plated through holes to electrically connect the at least one power core and the at least one signal plane. In addition, a layer of dielectric material is adjacent the power core and a circuitized conductive layer is adjacent the dielectric material, followed by a layer of photosensitive dielectric material adjacent the conductive layer. Photodeveloped blind vias for subsequent connection to the power core are provided and drilled blind vias for subsequent connection to the signal plane are provided.

In addition, the present invention is concerned with a process for fabricating a printed circuit board or card for direct chip attachment. The process of the present invention includes providing a sub-composite that comprises at least one power core and at least one signal plane adjacent the power core: and plated through holes to electrically connect the at least one power core and the at least one signal plane. A layer of dielectric material is provided adjacent the power core and a conductive layer adjacent the dielectric material is provided. Clearance holes into the conductive layer are photodeveloped. Then a layer of photosensitive dielectric is applied and the blind vias are photodeveloped for subsequent connection to the power core. Blind vias are drilled for subsequent connection to the signal plane.

BEST AND VARIOUS MODES FOR CARRYING OUT INVENTION

In order to facilitate an understanding of the present invention, reference is made to the Figures where like numerals in different Figures refer to the same or equivalent component. The Figures illustrate a preferred aspect of the present invention that employs a 4S3P tri-plate subcomposite to which a 1S1P redistribution structure is attached.

Figure 1:
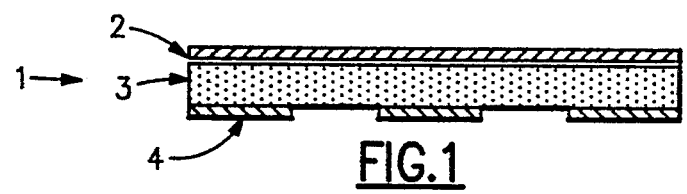
FIG. 1–6 are schematic diagrams of the printed circuit board or card in various stages of fabrication pursuant to the present invention.

FIG. 1 illustrates a power core 1 that is a laminate of a metallic layer 2, a dielectric substrate 3 and another metallic layer 4. The dielectric substrate 3 can include a thermoplastic and/or thermosetting resin. Typical thermosetting polymeric materials include epoxy, phenolic base materials, polyimides and polyamides. Examples of some phenolic type materials include copolymers of phenol, resorcinol, and cresol. Examples of some suitable thermoplastic polymeric materials include polyolefins such as polypropylene, polysulfones, polycarbonates, nitrile rubbers, ABS polymers, and fluorocarbon polymers such as polytetrafluoroethylene, polymers of chlorotrifluoroethylene, fluorinated ethylenepropylene polymers, polyvinylidene fluoride and polyhexafluoropropylene. The dielectric materials may be molded articles of the polymers containing fillers and/or reinforcing agents such as glass filled polymers.

Typical FR-4 epoxy compositions that are employed pursuant to the present invention contain 70–90 parts of brominated polyglycidyl ether of bisphenol-A and 10–30 parts of tetrakis (hydroxyphenyl) ethane tetraglycidyl ether cured with 3–4 parts of dicyandiamide, and 0.2–0.4 parts of a tertiary amine, all parts being parts by weight per hundred parts of resin solids. Another typical FR-4 epoxy composition contains about 25 to about 30 parts by weight of a tetrabrominated digylcidyl ether of bisphenol-A having an epoxy equivalent weight of about 350 to about 450; about 10 to about 15% by weight of a tetrabrominated glycidyl ether of bisphenol-A having an epoxy equivalent weight of approximately 600 to about 750 and about 55 to about 65 parts per weight of at least one epoxidized nonlinear novolak having at least 6 terminal epoxy groups; along with suitable curing and/or hardening agents. A still further FR-4 epoxy composition contains 70 to 90 parts of brominated polyglycidyl ether of bisphenol-A and 10 to 30 parts of tetrakis (hydroxyphenyl) ethane tetraglycidyl ether cured with 0.8–1phr of 2-methylimidazole. Still other FR-4 epoxy compositions employ tetrabromobisphenol-A as the curing agent along with 2-methylimidazole as the catalyst.

Figure 3:
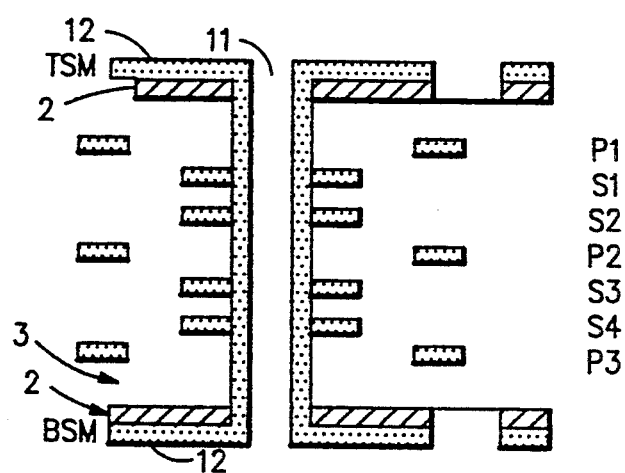

The thickness of the dielectric substrate 3 is about 2 to about 14 mils and preferably about 4 to about 6 mils. The conductive layer 2 is preferably copper and typically has a thickness of about 0.5 to about 1.5 mils and more typically about 0.5 to about 1 mil. The conductive layer 4 is preferably copper and typically has a thickness of about 1 to about 2 mils and more typically about 1 to about 1.4 mils. According to preferred aspects of the present invention, the top conductive layer 2 is thinner than the bottom conductive layer 4 in order to facilitate a subsequent full panel plating. When this power core is to be part of the top or bottom surface of the sub-composite, only a single-sided etch of conductive layer 4 is carried out. In particular, the conductive layer 4 is patterned by well known lithographic techniques to form the desired circuitry thereon. Conductive layer 2 is not etched or circuitized as illustrated in FIG. 1. Accordingly, the conductive layer 2 can become part of the top or bottom surface of the subcomposite. For the intermediate power cores such as P2 (see FIG. 3), the conductive layer 2 is entirely removed by etching to thereby provide a one-sided circuitized power core.

Figure 2:
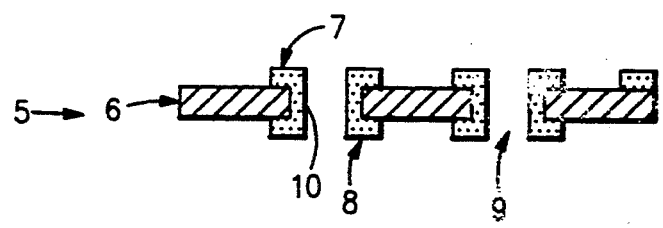

The signal cores or layers 5 (see FIG. 2), are composed of a dielectric substrate 6 having circuitized conductive layers 7 and 8 on opposite major surfaces of the substrate. The dielectric substrate 6 can be any of the thermoplastic or thermosetting polymeric substrates discussed above for the dielectric substrate to constitute the power cores and is preferably the same material and most preferably a FR-4 epoxy composition. Typically the dielectric substrate 6 is about 6 to about 20 mils thick and more typically about 12 to about. 16 mils thick. The circuitized metallic layers 7 and 8 are preferably copper and typically are about 0.5 to about 1.5 mils thick and more typically about 0.7 to about 1.2 mils thick. The copper layers 7 and 8 are preferably formed by first laminating copper foil treated pursuant to method described in U.S. Pat. No. 4,358,479 to both of the major surfaces of the dielectric substrate in order to pretreat the substrate for subsequent plating thereon. These copper layers, generally referred to as sacrificial copper layers, are then removed by etching in a known copper etchant composition. Next, the cores are drilled to provide the desired vias (9). The drilled vias are subjected to .well known seeding or catalyzing steps with palladium/tin catalyst, photoprocessing and then plating with a metal such as copper (10) in the desired areas followed by stripping by any remaining photoresist material to provide the desired circuitized signal core. The steps concerning the drilling, seeding, photoprocessing, plating and stripping are well known and need not be described herein in any great detail. For instance, see U.S. Pat. Nos. 4,478,883 to Bupp et al and 4,554,182 to Bupp et al, the disclosures of which are incorporated herein by reference.

The desired number of power cores and signal cores are then laminated together in the desired sequence. In the example illustrated in FIG. 3, a 4S3P tri-plate is provided. Though holes 11 are drilled to provide for subsequent electrical connection between layers. On the remaining copper surfaces 2 of the top power core P1 and bottom power core P3 is plated by full panel plate additional electrically conductive layers 12 such as copper to the desired thickness of about 1 to about 2 mils and more typically about 1.2 to about 1.5 mils. In addition, during this process the vias are likewise metalized. Next, copper is then removed from layer 11 to provide the desired circuitry on the top and bottom of the composite. The copper is removed by known photolithographic methods and employing known copper etchants. Likewise, vias to the top and bottom power cores P1 and P2 respectively are etched in the dielectric layers (see FIG. 3).

Figure 4:
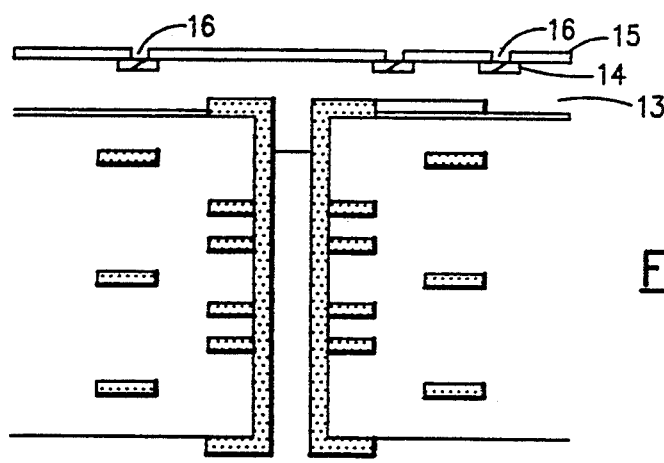

A dielectric layer 13 of about 0.5 to about 2 mils thick and more typically about 0.5 to about 1 mil thick is laminated adjacent to the circuitized metal layer 12 (see FIG. 4). The dielectric layer can be any of the dielectric materials as discussed above and is preferably a FR-4 epoxy composition of the type discussed herein above. In addition, a layer of electrically conductive material 14, preferably copper is also laminated to the composite and is located adjacent the dielectric layer 13. The electrically conductive layer 14 is typically about 0.3 to about 1 mil thick and preferably about 0.5 to about 0.7 mils thick.

Clearance holes 16 are etched into the copper at predetermined locations. Next, a photosensitive dielectric layer 15 is applied above the copper layer 14. Suitable photosensitive dielectric materials include OPR (Optimized Permanent Resist described in U.S. Pat. No. 4,940,651 to Brown et al., entire disclosure of which is incorporated herein by reference), HTM (High Temperature Mask) described in copending U.S. application Ser. No. 07/382,311 to Gelorme et al. filed in the U.S. Patent and Trademark Office on Jul. 20, 1989, entire disclosure of which is incorporated herein by reference and commonly assigned to the present assignee. The dielectric layer 15 typically about 0.2 to about 0.6 mils thick and preferably about 0.2 to about 0.4 mils thick. Blind vias 17 are developed within the photosensitive dielectric layer to provide for subsequent electrical connection between the power core P1 and the subsequently to be applied chip. The blind vias 17 are typically about 0.5 to about 1.5 mils deep. Forming these vias employing a photosensitive dielectric layer is a much simpler and significantly less costly procedure than for example employing laser drilling and accordingly is advantageous from that viewpoint.

Next, larger blind vias 18 of about 6 to about 14 mils and more typically about 6 to about 10 mils deep are then mechanically drilled to provide for electrical connection between the signal frames and the chip to be subsequently applied. In addition, if desired, through holes (not Shown) can likewise be drilled at this particular point in the process.

Figure 5:
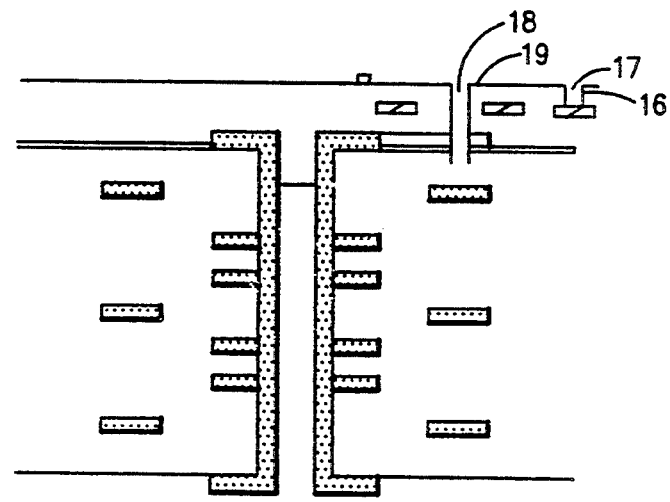

Next, the desired circuitry 19 on the photosensitive dielectric layer as well as in the blind vias are provided by well known seeding, photolithographic processing, plating and subsequent stripping of the photoresist material employed to provide the configuration as illustrated in FIG. 5.

Figure 6:
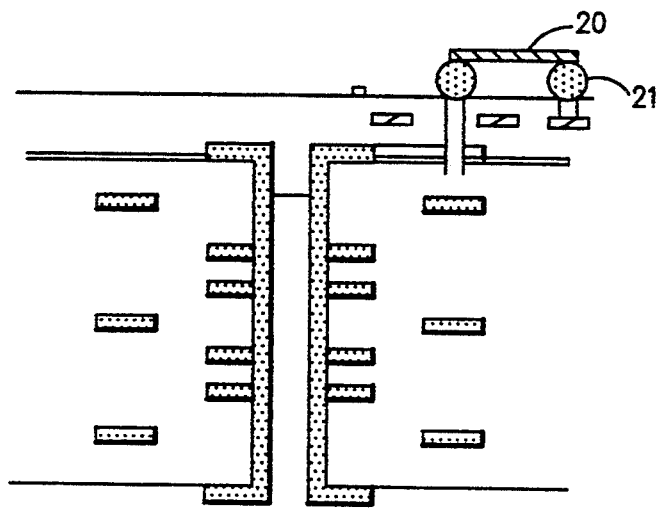

Next, a solder mask is then applied above the circuitry followed by joining integrated circuit chip 20 to the composite. The chip 20 can be joined by any well known soldering method such as employing screened solder paste, electroplating suitable solder or enhanced wave soldering as well as high temperature joining. Typical solder 21 includes relatively low melting solders such as a 60/40 lead-tin solder (see FIG. 6). As apparent from the above, the present invention makes it possible to eliminate an entire level of packaging by being able to directly bond the chip to the card. In addition, by the present invention relatively high density wiring can be achieved such as in the neighborhood of about 1,000In/In$^2$.

Figure 7:
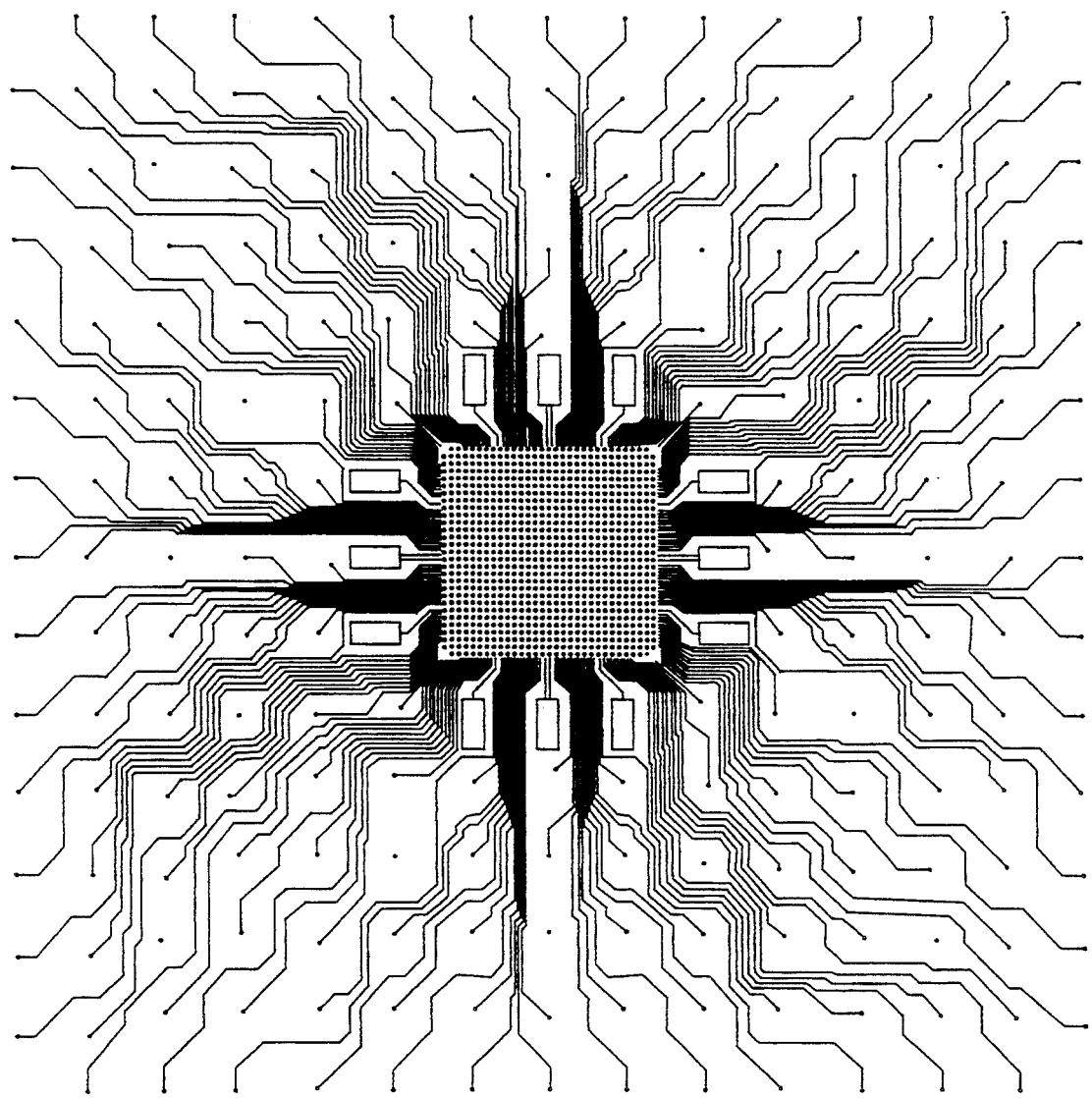
FIG. 7 illustrates a typical arrangement for signal connections from a chip pattern that is achievable pursuant to the present invention.

A typical chip circuitry pattern that can be employed along with the integrated circuit card of the present invention is illustrated in FIG. 7. The circuitry as apparent is a fan-out pattern whereby typically such fans-out from one mil lines up to about 4 mil lines.

What is claimed is:

1. A printed circuit board or card for direct chip attachment which comprises at least one power core, at least one signal plane adjacent to said power core, plated through holes to electrically connect said at least one power core and said at least one signal plane; layer of dielectric material adjacent said power core, circuitized conductive layer adjacent said dielectric material; a layer of photosensitive dielectric adjacent said conductive layer; photodeveloped blind vias for subsequent connection to said power core; drilled blind vias for subsequent connection to said signal plane.

2. The printed circuit board or card of claim 1 which includes a 4S3P triplate composite.

3. The printed circuit board or card of claim 1 which further includes at least one integrated circuit chip directly joined to it and wherein said at least one integrated circuit chip is electrically connected to a signal plane and power core of said board or card.

4. The printed circuit board or card of claim 1 wherein said chip is joined thereto with solder.

5. The printed circuit board or card of claim 1 wherein the photodeveloped blind vias are about 0.5 to about 1.5 mils deep and the drilled blind vias are about 6 to about 14 mils deep.

6. The printed circuit board or card of claim 1 wherein said blind vias are plated with an electrically conductive layer.

* * * * *